US012107597B2

(12) United States Patent
Huang et al.

(10) Patent No.: US 12,107,597 B2
(45) Date of Patent: Oct. 1, 2024

(54) SUCCESSIVE APPROXIMATION REGISTER ANALOG TO DIGITAL CONVERTER DEVICE AND SIGNAL CONVERSION METHOD

(71) Applicant: REALTEK SEMICONDUCTOR CORPORATION, Hsinchu (TW)

(72) Inventors: Shih-Hsiung Huang, Hsinchu (TW); Wei-Cian Hong, Hsinchu (TW); Sheng-Yen Shih, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 170 days.

(21) Appl. No.: 17/857,621

(22) Filed: Jul. 5, 2022

(65) Prior Publication Data
US 2023/0115471 A1  Apr. 13, 2023

(30) Foreign Application Priority Data
Oct. 13, 2021 (TW) ................................ 110137929

(51) Int. Cl.
*H03M 1/12* (2006.01)
*H03M 1/46* (2006.01)

(52) U.S. Cl.
CPC ......... *H03M 1/468* (2013.01); *H03M 1/1245* (2013.01)

(58) Field of Classification Search
CPC ............................. H03M 1/468; H03M 1/1245
(Continued)

(56) References Cited

U.S. PATENT DOCUMENTS 10,972,118 B1 * 4/2021 Abu Hilal ............. H03M 1/363
2011/0122006 A1 * 5/2011 Liao ..................... H03M 1/1047
341/120

(Continued)

OTHER PUBLICATIONS

OA letter of a counterpart TW application (appl. no. 110137929) mailed on Jun. 2, 2022. Summary of the TW OA letter: 1.Claims 1-2 and 8-9 are rejected as allegedly being unpatentable over cited reference 1 (US 2019/0313042 A1). 2. Claims 3-7 and 10 are allowable.Correspondence between claims of TW counterpart application and claims of US application:1. Claims 1-10 in TW counterpart application correspond to claims 1-10 in US application, respectively.

(Continued)

*Primary Examiner* — Peguy Jean Pierre
(74) *Attorney, Agent, or Firm* — WPAT, P.C (57) ABSTRACT

A successive approximation register analog to digital converter includes a charge injection digital to analog converter (DAC) circuit, a comparator circuit, and a control logic circuitry. The charge injection DAC circuit includes capacitors that sample input signals to generate first and second signals and charge injection circuits that selectively adjust the first or the second signals according to enable signals and decision signals. The comparator circuit compares the first and second signals to generate the decision signals. The control logic circuitry controls a circuit of the charge injection circuits to adjust the first and the second signals during an initial phase, in order to adjust a switching sequence of the circuit according to the decision signals corresponding to the initial phase, and generates the enable signals according to the decision signals and the adjusted switching sequence during a conversion phase to generate a digital output.

12 Claims, 5 Drawing Sheets

(58) Field of Classification Search
USPC .................................... 341/144, 155, 172
See application file for complete search history.

(56) References Cited

U.S. PATENT DOCUMENTS

2019/0313042 A1    10/2019  Janbu
2022/0376698 A1*   11/2022  Cho ................... H03M 1/466

OTHER PUBLICATIONS

K. D. Choo, J. Bell and M. P. Flynn, "27.3 Area-efficient 1GS/s 6b SAR ADC with charge-injection-cell-based DAC," 2016 IEEE International Solid-State Circuits Conference (ISSCC), 2016, pp. 460-461, doi: 10.1109/ISSCC.2016.7418106.

* cited by examiner

SUCCESSIVE APPROXIMATION REGISTER ANALOG TO DIGITAL CONVERTER DEVICE AND SIGNAL CONVERSION METHOD

BACKGROUND OF THE INVENTION

1. Field of the Invention

The present disclosure relates to an analog to digital converter, especially to a successive approximation register analog to digital converter device that utilizes a charge injection circuit and a signal conversion method thereof.

2. Description of Related Art

In a successive approximation register analog to digital converter, a digital analog converter circuit may be sequentially switched in the process of analog to digital conversion, in order to perform related operations in the successive approximation register algorithm. In some approaches, the digital analog converter circuit may be implemented with a current digital analog converter. However, in those approaches, in order to reduce the impacts due to mismatches between multiple current source circuits in the current analog converter, an additional digital to analog converter(s) is employed to calibrate (or compensate) the current source circuits. To ensure the accuracy of the additional digital to analog converter, this additional digital to analog converter will be implemented with circuits having a larger circuit area. As a result, the overall circuit area and the device cost will be increased significantly.

SUMMARY OF THE INVENTION

In some aspects of the present disclosure, a successive approximation register analog to digital converter device includes a charge injection digital to analog converter circuit, a comparator circuit, and a control logic circuitry. The charge injection digital to analog converter circuit includes a plurality of capacitors and a plurality of charge injection circuits, in which the plurality of capacitors are configured to respectively sample a plurality of input signals to generate a first signal and a second signal, and the plurality of charge injection circuits are configured to selectively adjust at least one of the first signal or the second signal according to a plurality of enable signals and a plurality of decision signals. The comparator circuit is configured to compare the first signal with the second signal to generate the plurality of decision signals. The control logic circuitry is configured to control a first charge injection circuit in the plurality of charge injection circuits to adjust the first signal and the second signal during an initial phase to adjust a switching sequence of the first charge injection circuit according to the plurality of decision signals corresponding to the initial phase, and generate the plurality of enable signals according to the plurality of decision signals and an adjusted switching sequence during an analog to digital conversion phase, in order to generate a digital output.

In some aspects of the present disclosure, a signal conversion method includes the following operations: respectively sampling, by a plurality of capacitors, a plurality of input signals to generate a first signal and a second signal; selectively adjusting, by a plurality of charge injection circuits, at least one of the first signal or the second signal according to a plurality of enable signals and a plurality of decision signals; comparing the first signal with the second signal to generate the plurality of decision signals; controlling a first charge injection circuit in the plurality of charge injection circuits to adjust the first signal and the second signal during an initial phase, in order to adjust a switching sequence of the first charge injection circuit according to the plurality of decision signals corresponding to the initial phase; and generating the plurality of decision signals according to the plurality of decision signals and an adjusted switching sequence during an analog to digital conversion phase, in order to generate a digital output.

These and other objectives of the present disclosure will no doubt become obvious to those of ordinary skill in the art after reading the following detailed description of the preferred embodiments that are illustrated in the various figures and drawings.

DETAILED DESCRIPTION OF THE PREFERRED EMBODIMENTS

The terms used in this specification generally have their ordinary meanings in the art and in the specific context where each term is used. The use of examples in this specification, including examples of any terms discussed herein, is illustrative only, and in no way limits the scope and meaning of the disclosure or of any exemplified term. Likewise, the present disclosure is not limited to various embodiments given in this specification.

In this document, the term "coupled" may also be termed as "electrically coupled," and the term "connected" may be termed as "electrically connected." "Coupled" and "connected" may mean "directly coupled" and "directly connected" respectively, or "indirectly coupled" and "indirectly connected" respectively. "Coupled" and "connected" may also be used to indicate that two or more elements cooperate or interact with each other. In this document, the term "circuitry" may indicate a system formed with one or more circuits, and the term "circuit" may indicate an object, which is formed with one or more transistors and/or one or more active/passive elements based on a specific arrangement, for processing signals.

As used herein, the term "and/or" includes any and all combinations of one or more of the associated listed items. Although the terms "first," "second," etc., may be used herein to describe various elements, these elements should not be limited by these terms. These terms are used to distinguish one element from another. For example, a first element could be termed a second element, and, similarly, a second element could be termed a first element, without departing from the scope of the embodiments. For ease of understanding, like elements in various figures are designated with the same reference number.

Figure 1:
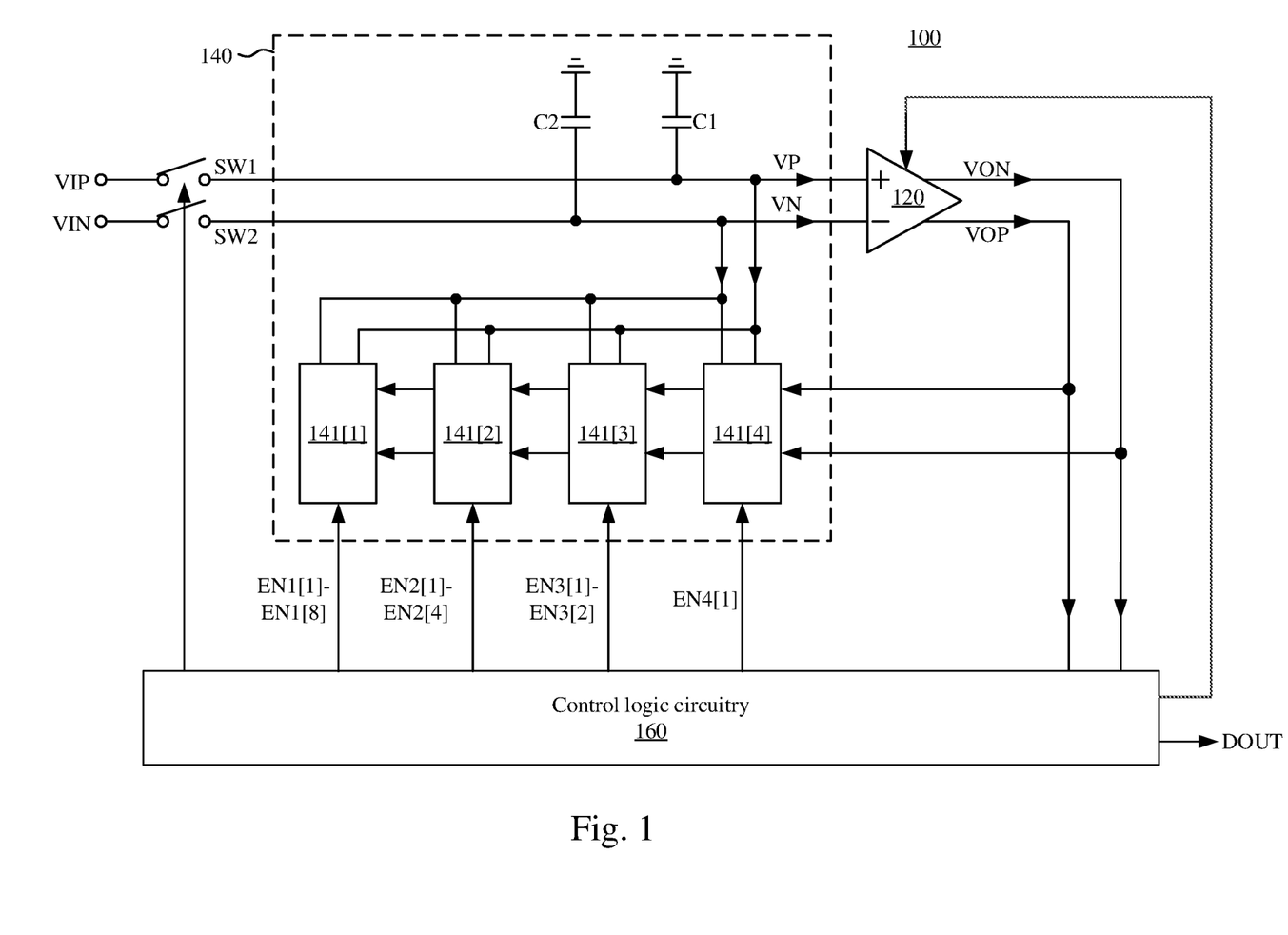
FIG. 1 shows a schematic diagram of a successive approximation register analog to digital converter according to some embodiments of the present disclosure.

FIG. 1 shows a schematic diagram of a successive approximation register analog to digital converter 100 according to some embodiments of the present disclosure. The successive approximation register analog to digital converter 100 includes a switch SW1, a switch SW2, a comparator circuit 120, a charge injection digital to analog converter circuit 140, and a control logic circuitry 160.

Based on the control of the control logic circuitry 160, the switch SW1 and the switch SW2 are turned on during a sampling phase to transmit an input signal VIP and an input signal VIN to the charge injection digital to analog converter circuit 140. Based on the control of the control logic circuitry 160, the switch SW1 and the switch SW2 are not turned on during the successive approximation register analog to digital converter 100 operates in an analog to digital conversion phase.

The charge injection digital to analog converter circuit 140 includes a capacitor C1, a capacitor C2, and charge injection circuits 141[1]-141[4]. During the successive approximation register analog to digital converter 100 operates in the sampling phase, the capacitor C1 and the capacitor C2 respectively samples the input signal VIP and the input signal VIN to generate a signal VP and a signal VN. During the successive approximation register analog to digital converter 100 operates in the analog to digital conversion phase, the charge injection circuits 141[1]-141[4] may selectively adjust charges stored in at least one of the capacitor C1 or the capacitor C2 according to enable signals EN1[1]-EN1[8], EN2[1]-EN2[4], EN3[1]-EN3 [2], and EN4[1], a decision signal VOP, and a decision signal VON, in order to adjust the level of the signal VP and/or the level of the signal VN.

In this embodiment, the charge injection circuits 141[1]-141[4] are configured to drain currents from the capacitor C1 or the capacitor C2. For example, the charge injection circuit 141[1] may be enabled according to the enable signals EN1[1]-EN1[8], and determine whether to drain the current from the capacitor C1 or the capacitor C2 or not to drain the current from the capacitor C1 and the capacitor C2 according to the decision signal VOP and the decision signal VON. The charge injection circuit 141[2] may be enabled according to the enable signals EN2[1]-EN2[4], and determine whether to drain the current from the capacitor C1 or the capacitor C2 or not to drain the current from the capacitor C1 and the capacitor C2 according to the decision signal VOP and the decision signal VON. The charge injection circuit 141[3] may be enabled according to the enable signals EN3[1]-EN3[2], and determine whether to drain the current from the capacitor C1 or the capacitor C2 or not to drain the current from the capacitor C1 and the capacitor C2 according to the decision signal VOP and the decision signal VON. The charge injection circuit 141[4] may be enabled according to the enable signal EN4[1] and may determine whether to drain the current from the capacitor C1 or the capacitor C2 or not to drain the current from the capacitor C1 and the capacitor C2 according to the decision signal VOP and the decision signal VON. For ease of understanding, the currents drained by the charge injection circuits 141[1]-141[4] may be sequentially set to be 8I, 4I, 2I, and 1I based on binary code, in which I is a unit current, and the present disclosure is not limited thereto. Arrangements regarding the charge injection circuits 141[1]-141[4] will be described with reference to FIG. 2.

In some embodiments, the control logic circuitry 160 may control timings of the switch SW1, the switch SW2, the comparator circuit 120, and the charge injection digital to analog converter circuit 140. The control logic circuitry 160 may control at least one circuit (hereinafter referred to as "first charge injection circuit) in the charge injection circuits 141[1]-141[4] to adjust the signal VP and the signal VN during an initial phase, and the comparator circuit 120 may compare the signal VP with the signal VN during the initial phase to generate the decision signals VON and VOP that correspond to the initial phase. The control logic circuitry 160 may adjust a switching sequence of the first charge injection circuit according to the decision signals VON and VOP that correspond to the initial phase. As a result, the linearity of the first charge injection circuit can be improved, in order to increase the resolution of a digital output DOUT. In some embodiments, the control logic circuitry 160 may adjust the switching sequence during the initial phase based on currents of current source circuits (e.g., the current source circuits 203[1]-203[8] in FIG. 3A) in the first charge injection circuit. Operations regarding herein will be given with reference to FIG. 3A and FIG. 3B.

In some embodiments, the initial phase may be, but not limited, to a predetermined interval after the successive approximation register analog to digital converter 100 is first powered on. In some embodiments, the first charge injection circuit may be a charge injection circuit corresponding to a most significant bit (e.g., the charge injection circuit 141[1]) in the charge injection digital to analog converter circuit 140. In some other embodiments, the first charge injection circuit may be all charge injection circuits having multiple current source circuits (e.g., the charge injection circuits 141[1]-141[3]) in the charge injection digital to analog converter circuit 140.

During the analog to digital conversion phase, the comparator circuit 120 may compare the signal VP with the signal VN to generate the decision signal VON and the decision signal VOP. The control logic circuitry 160 may generate the enable signals EN1[1]-EN1[8], EN2[1]-EN2[4], EN3[1]-EN3 [2], and EN4[1] and generate the digital output DOUT according to the decision signals VON and VOP that correspond to the analog to digital conversion phase and the adjusted switching sequence. For example, the control logic circuitry 160 may perform a successive approximation register (SAR) algorithm (which may be, but not limited to, a binary search algorithm) according to the decision signals VON and VOP that correspond to the analog to digital conversion phase, and generate the enable signals EN1[1]-EN1[8], EN2[1]-EN2[4], EN3[1]-EN3[2], and EN4[1] according to the adjusted switching sequence.

In the above progress, the control logic circuitry 160 may perform the SAR algorithm according to the decision signal VON and the decision signal VOP determined in each comparison, in order to determine a bit of the digital output DOUT. In some embodiments, the control logic circuitry 160 may be implemented with one or more digital signal processor circuits that perform the SAR algorithm, control the timing of other circuits in the successive approximation register analog to digital converter 100, and calibrate the first charge injection circuit during the initial phase (i.e., operations in FIG. 3A).

Figure 2:
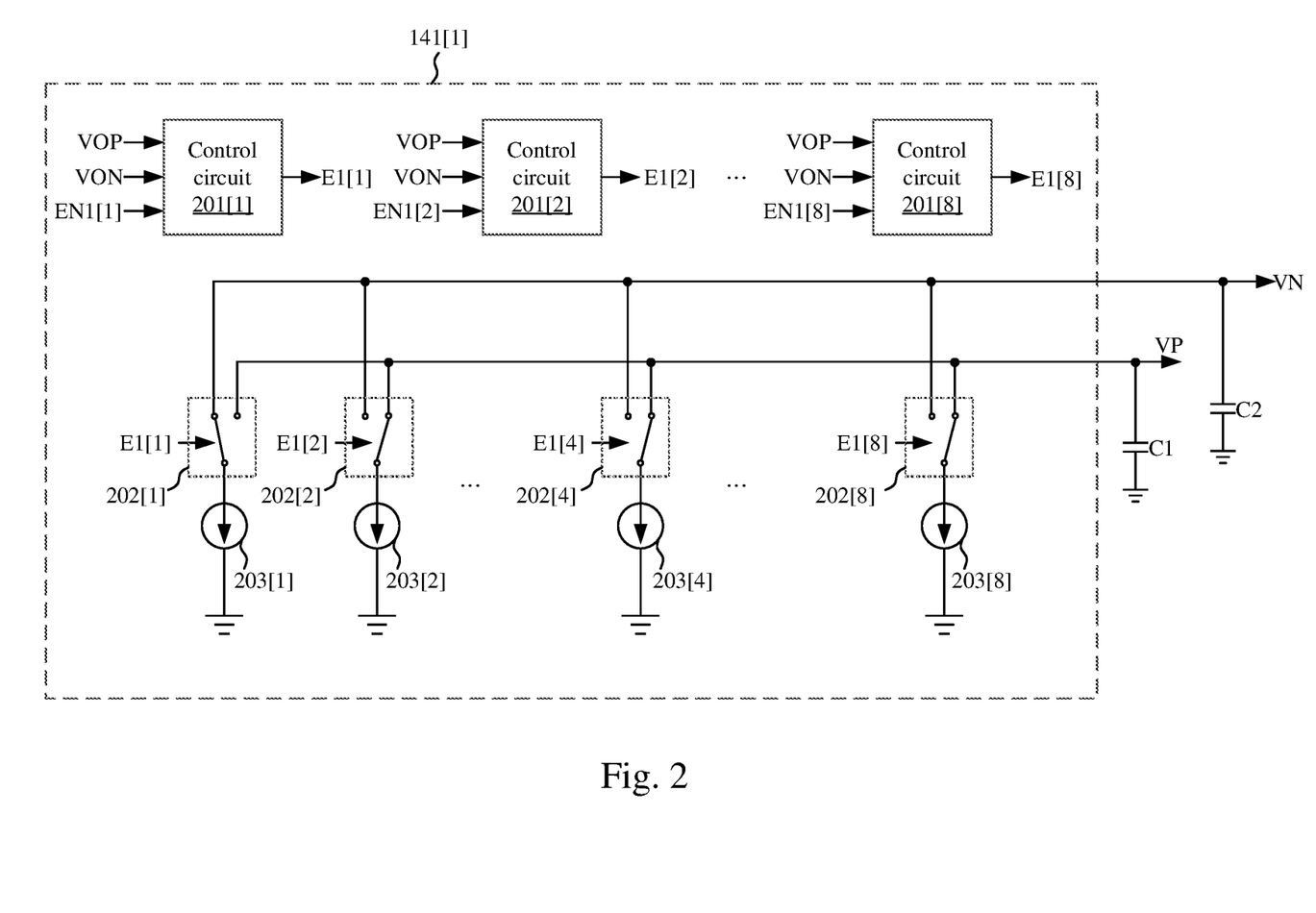
FIG. 2 shows a schematic diagram of the charge injection circuit in FIG. 1 according to some embodiments of the present disclosure.

FIG. 2 shows a schematic diagram of the charge injection circuit 141[1] in FIG. 1 according to some embodiments of the present disclosure. In this example, the charge injection circuit 141[1] includes control circuits 201[1]-201[8], switching circuits 202[1]-202[8], and the current source circuits 203[1]-203[8]. For simplicity, serval circuits in the aforementioned circuits are omitted in the figure.

Each of the control circuits 201[1]-201[8] generates one of switching signals E1[1]-E1[8] according to the decision signal VOP, the decision signal VON, and a corresponding one of the enable signals EN1[1]-EN1[8]. In greater detail, the control circuit 201[1] generates the switching signal E1[1] according to the enable signal EN1[1], the decision signal VOP, and the decision signal VON. The control circuit 201[2] generates the switching signal E1[2] according to the enable signal EN1[2], the decision signal VOP, and the decision signal VON. With this analogy, the control circuit 201[8] generates the switching signal E1[8] according to the enable signal EN1[8], the decision signal VOP, and the decision signal VON. In some embodiments, each of the control circuits 201[1]-201[8] may be implemented with logic gate circuits, in order to generate control bits in the corresponding one of the switching signals E1[1]-E1[8].

Each of the switching circuits 202[1]-202[8] is selectively connected to one of the capacitor C1 and the capacitor C2 or is disconnected from both of the capacitors C1 and C2 according to a corresponding one of the switching signals E1[1]-E1[8]. For example, each of the switching circuits 202[1]-202[8] may be implemented with multiple switches. Those switches may be selectively turned on according to bits of the corresponding one of the switching signals E1[1]-E1[8] to be connected with the capacitor C1 or the capacitor C2, or may be all turned off according to those bits to be disconnected from both of the capacitor C1 and the capacitor C2. Each of the current source circuits 203[1]-203[8] may be connected to the capacitor C1 or the capacitor C2 via a corresponding one of the switching circuits 202[1]-202[8], in order to discharge the capacitor C1 or the capacitor C2 (i.e., draining current from the capacitor C1 or the capacitor C2). For example, the switching circuit 202[1] may be connected to the capacitor C1 according to the switching signal E1[1], and the current source circuit 203[1] may be connected to the capacitor C1 via the switching circuit 202[1], in order to discharge the capacitor C1. As a result, the level of the signal VP will be lower. Alternatively, if a corresponding switching circuit in the switching circuits 202[1]-202[8] (e.g., the switching circuit 202[1]) is disconnected from the capacitor C1 and the capacitor C2, a corresponding one of the current source circuits 203[1]-203[8] (e.g., the current source circuit 203[1]) cannot discharge the capacitor C1 or the capacitor C2 via the corresponding switching circuit (i.e., not draining current from the capacitor C1 and the capacitor C2). With this analogy, the arrangements between the remaining switching circuits 202[2]-202[8] and the remaining current source circuits 203[2]-203[8] can be understood.

As mentioned above, the current drained by the charge injection circuit 141[1] is 8I. In this example, the current source circuits 203[1]-203[8] are arranged based on thermometer code. In other words, the current drained by each of the current source circuits 203[1]-203[8] is a unit current I. When all of the current source circuits 203[1]-203[8] are enabled (i.e., all of the switching circuits 202[1]-202[8] are turned on to be connected with the capacitor C1 or the capacitor C2), the total current drained by the charge injection circuit 141[1] from the capacitor C1 or the capacitor C2 is 8I.

The arrangements of the charge injection circuits 141[2]-141[4] are similar to the arrangement of the charge injection circuit 141[1], and thus the repetitious descriptions are not further given. It is understood that, the number of circuits shown in FIG. 1 and FIG. 2 and the current values are given for illustrative purposes, and the present disclosure is not limited thereto. According to different requirements of the practical applications, the number of circuits in FIG. 1 and FIG. 2 and/or the current values can be adjusted correspondingly.

Figure 3A:
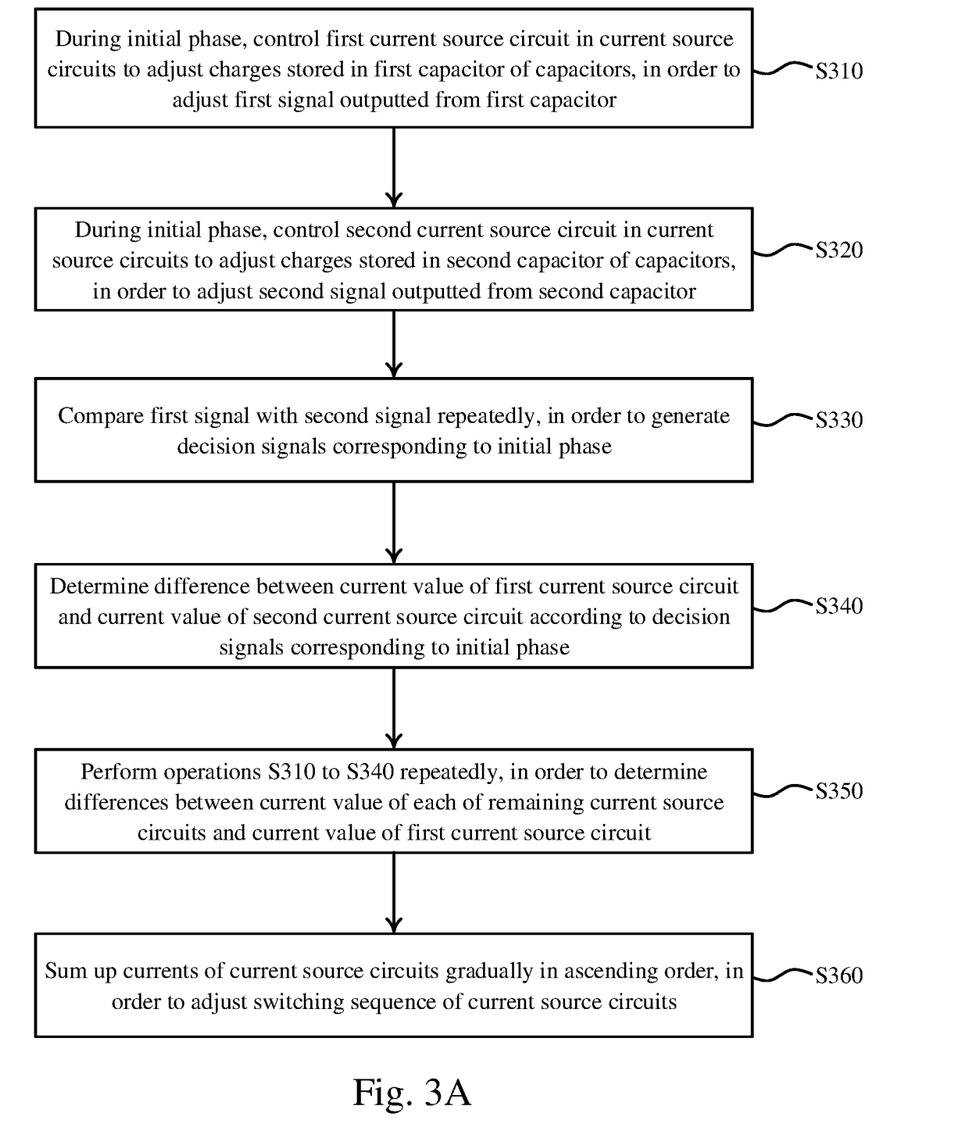
FIG. 3A shows a flow chart of operations performed by the control logic circuitry in FIG. 1 during the initial phase according to some embodiments of the present disclosure.
Figure 3B:
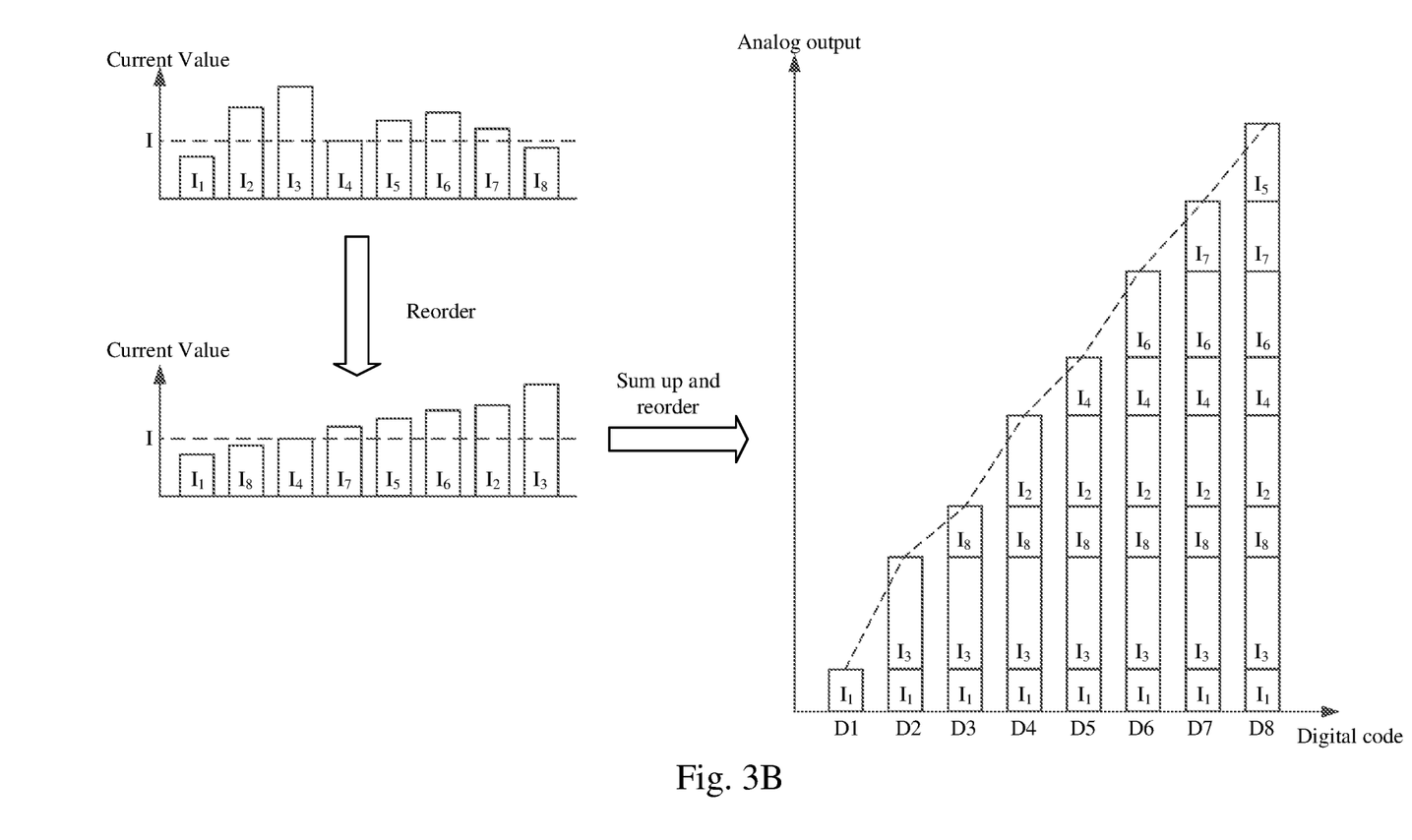
FIG. 3B shows a schematic diagram of concept about partial operations in FIG. 3A according to some embodiments of the present disclosure.

FIG. 3A shows a flow chart of operations performed by the control logic circuitry 160 in FIG. 1 during the initial phase according to some embodiments of the present disclosure. FIG. 3B shows a schematic diagram of concept about partial operations in FIG. 3A according to some embodiments of the present disclosure. For ease of understanding of operations about adjusting the switching sequence of the charge injection circuit 141[1], reference is now made to FIG. 3A and FIG. 3B.

As shown in FIG. 3B, the currents of the current source circuits 203[1]-203[8] are sequentially $I_1$-$I_8$. Ideally, each of the currents $I_1$-$I_8$ is the unit current I (i.e., the weight of each of the current source circuits 203[1]-203[8] is the same as each other), and the control logic circuitry 160 may switch at least one corresponding one in the current source circuits 203[1]-203[8] to generate a corresponding analog output according to the digital code and a predetermined switching sequence. The predetermined switching may be enabling a corresponding number of current source circuits according to the serial number of the current source circuits 203[1]-203[8]. For example, if the digital code corresponds to the value of 1, the control logic circuitry 160 may enable the current source circuit 203[1] to generate the corresponding analog output (i.e., the unit current I). If the digital code corresponds to the value of 2, the control logic circuitry 160 may enable the current source circuit 203[1] and the current source circuit 203[2] to generate the corresponding analog output (i.e., two times the unit current I). However, because of the impacts from process variations, mismatches may exist between the current source circuits 203[1]-203[8], which results in offsets of the currents $I_1$-$I_8$ (i.e., errors of the weights of the current source circuits 203[1]-203[8]). Under this condition, if the control logic circuitry 160 enables the current source circuits 203[1]-203[8] according to the predetermined switching sequence, the analog output having lower linearity may be generated. In order to improve the linearity, the control logic circuitry 160 may perform operations in FIG. 3A during the initial phase to adjust the switching sequence of the current source circuits 203[1]-203[8] (which equals to calibrate the weights of the current source circuits 203[1]-203[8]).

Reference is made to FIG. 3A, in operation S310, during the initial phase, a first current source circuit (e.g., the current source circuit 203[4]) in the current source circuits is controlled to adjust charges stored in a first capacitor (e.g., the capacitor C1) of the capacitors, in order to adjust a first signal (e.g., the signal VP) outputted from the first capacitor. In operation S320, during the initial phase, a second current source circuit (e.g., the current source circuit 203[1]) in the current source circuits is controlled to adjust charges stored in a second capacitor (e.g., the capacitor C2) of the capacitors, in order to adjust a second signal (e.g., the signal VN) outputted from the second capacitor.

For example, during the initial phase, the capacitor C1 and the capacitor C2 are reset by a predetermined voltage (which may be, but not limited to, a common mode voltage) to store a predetermined amount of charges. If the current $I_4$ of the current source circuit 203[4] is employed as a reference value, the control logic circuitry 160 may output the enable signal EN1[4] to control the current source circuit 203[4] to drain the current $I_4$ form the capacitor C1. As a result, the amount of charges stored in the capacitor C1 will be lower, in order to adjust the level of the signal VP. Similarly, during the initial phase, the control logic circuitry 160 may output the enable signal EN1[1] to control the current source circuit 203[1] to drain the current $I_1$ from the capacitor C2. As a result, the amount of charges stored in the capacitor C2 will be lower, in order to adjust the level of the signal VN.

With continued reference to FIG. 3A, in operation S330, the first signal and the second signal are compared with each other repeatedly, in order to generate decision signals corresponding the initial phase (e.g., the decision signal VON and the decision signal VOP). In operation S340, a difference between the current value of the first current source circuit and the current value of the second current source circuit is determined according to the decision signals corresponding to the initial phase.

In the previous examples, if the signal VP is lower than the signal VN, the comparator circuit 120 outputs the decision signal VON having a first logic value (e.g., the logic value of 1) and the decision signal VOP having a second logic value (e.g., the logic value of 0). Under this condition, it indicates that the amount of charges stored in the capacitor C1 is less than that in the capacitor C2. In other words, compared with the current source circuit 203[1], the current source circuit 203[4] may drain more charges during the same interval. Therefore, the control logic circuitry 160 may determine that the current $I_4$ of the current source circuit 203[4] is higher than the current $I_1$ of the current source circuit 203[1]. Alternatively, if the signal VP is higher than the signal VN, the comparator circuit 120 outputs the decision signal VON having the second logic value (e.g., the logic value of 0) and the decision signal VOP having the first logic value (e.g., the logic value of 1). Under this condition, it indicates that the amount of charges stored in the capacitor C1 is more than that in the capacitor C2. In other words, compared with the current source circuit 203[1], the current source circuit 203[4] drains less charges during the same interval. Therefore, the control logic circuitry 160 may determine that the current $I_4$ of the current source circuit 203[4] is lower than the current $I_1$ of the current source circuit 203[1].

Based on the above operations, the comparator circuit 120 may repeatedly compare the signal VP with the signal VN, in order to obtain more sets (which may be, but not limited to, 1000 sets) of the decision signals VON and VOP. The comparator circuit 120 may store the decision signal VON and the decision signal VOP, in order to determine the difference between the current $I_4$ of the current source circuit 203[4] and the current $I_1$ of the current source circuit 203[1].

With continued reference to FIG. 3A, in operation S350, operation S310 to operation S340 are repeatedly performed, in order to determine differences between the current value of each of the remaining current source circuits and the current value (e.g., the value of the current $I_4$) of the first current source circuit. For example, the control logic circuitry 160 may reset the capacitor C1 and the capacitor C2 again, and control the current source circuit 203[4] to drain the current $I_4$ from the capacitor C1 (as mentioned above, the current $I_4$ is assumed to be the reference value), and control the current source circuit 203[2] to drain the current $I_2$ from the capacitor C2. Afterwards, the comparator circuit 120 may repeatedly compare the signal VP with the signal VN, in order to obtain more sets of the decision signal VON and the decision signal VOP. The comparator circuit 120 may store the decision signals VON and VOP, in order to determine the difference between the current $I_4$ of the current source circuit 203[4] and the current $I_2$ of the current source circuit 203[2]. By this analogy, the control logic circuitry 160 may obtain multiple sets of the decision signals VOP and VON, in order to determine the differences between the currents $I_1$-$I_8$.

For example, in 1000 comparison results of the current source circuit 203[4] and the current source circuit 203[1], 700 comparison results (e.g., the number of times when the decision signal VON has the logic value of 1 and the decision signal VOP has the logic value of 0) indicate that the current $I_1$ is higher than the current $I_1$. In 1000 comparison results of the current source circuit 203[4] and the current source circuit 203[2], 800 comparison results (e.g., the number of times when the decision signal VON has the logic value of 0 and the decision signal VOP has the logic value of 1) indicate that the current $I_4$ is lower than the current $I_2$. In 1000 comparison results of the current source circuit 203[4] and the current source circuit 203[3], 990 comparison results (e.g., the number of times when the decision signal VON has the logic value of 0 and the decision signal VOP has the logic value of 1) indicate that the current $I_4$ is lower than the current $I_3$. Based on the above sets of the decision signals VOP and VON, the control logic circuitry 160 may determine that the value of the current $I_4$ is higher than the value of the current $I_1$, and the value of the current $I_3$ is higher than the current $I_2$ and the value of the current $I_4$, which may be expressed as follows: $I_3>I_2>I_4>I_1$. By this analogy, as shown in FIG. 3B, the control logic circuitry 160 may reorder the values of the currents $I_1$-$I_8$ according to the sets of the decision signals VOP and VON.

For illustrative purposes, the above operations of majority voting are given to illustrate an implementation of operation S350, but the present disclosure is not limited thereto. In other embodiments, the control logic circuitry 160 may perform a statistical calculation based on the sets of the decision signals VOP and VON to determine the differences between the values of the currents $I_1$-$I_8$. Moreover, the values given in the above examples are for illustrative purposes, and the present disclosure is not limited thereto.

With continued reference to FIG. 3A, in operation S360, the currents of the current source circuits are gradually summed up in an ascending order, in order to adjust the switching sequence of the current source circuits.

For example, as shown in FIG. 3B, the control logic circuitry 160 may switch the current source circuits 203[1]-203[8] according to the ascending order of the digital code. For example, in response to a digital code D1, the current source circuit 203[1] having a lowest current $I_1$ is selected (i.e., enabled) to generate the corresponding analog output (i.e., the current $I_1$). In response to a digital code D2, the current source circuit 203[1] and the current source circuit 203[3] having the highest current $I_3$ are selected to generate a corresponding analog output (i.e., the summation of the current $I_1$ and the current $I_3$). In response to a digital code D3, the current source circuit 203[1], the current source circuit 203[3], and the current source circuit 203[8] having the second low current $I_8$ are selected to generate the corresponding analog output (i.e., the summation of the current $I_1$, the current $I_3$, and the current $I_8$). By this analogy, the control logic circuitry 160 may gradually summing up the currents of the current source circuits 203[1]-203[8] according to the remaining digital codes D5-D8, in order to adjust the switching sequence. As a result, the analog output having better linearity (as shown in dotted lines in FIG. 3B) can be generated.

In some embodiments, the control logic circuitry 160 further includes a register circuit (not shown in the figure) which may store a corresponding relation between the enable signals EN1[1]-EN1[8] and the adjusted switching sequence. For example, after the corresponding relation is stored, during the analog to digital conversion phase, if the control logic circuitry 160 determines a digital code in the digital output DOUT is the digital code D1 in response to the decision signal VOP and the decision signal VON, the control logic circuitry 160 may output the enable signal EN1[1] having a corresponding logic value to enable the current source circuit 203[1]. Alternatively, if the control logic circuitry 160 determines that the digital code in the digital output DOUT is the digital code D2 in response to the decision signal VOP and the decision signal VON, the control logic circuitry 160 may output the e enable signal EN1[1] and the enable signal EN1[3] that have the corresponding logic values, in order to enable the current source circuits 203[1] and 203[3].

With the above operations, the control logic circuitry 160 may calibrate the charge injection digital to analog converter circuit 140 without employing additional digital to analog converter(s) or current source circuit(s). As a result, the linearity of the charge injection digital to analog converter circuit 140 can be improved without significantly increasing the circuit area.

Figure 4:
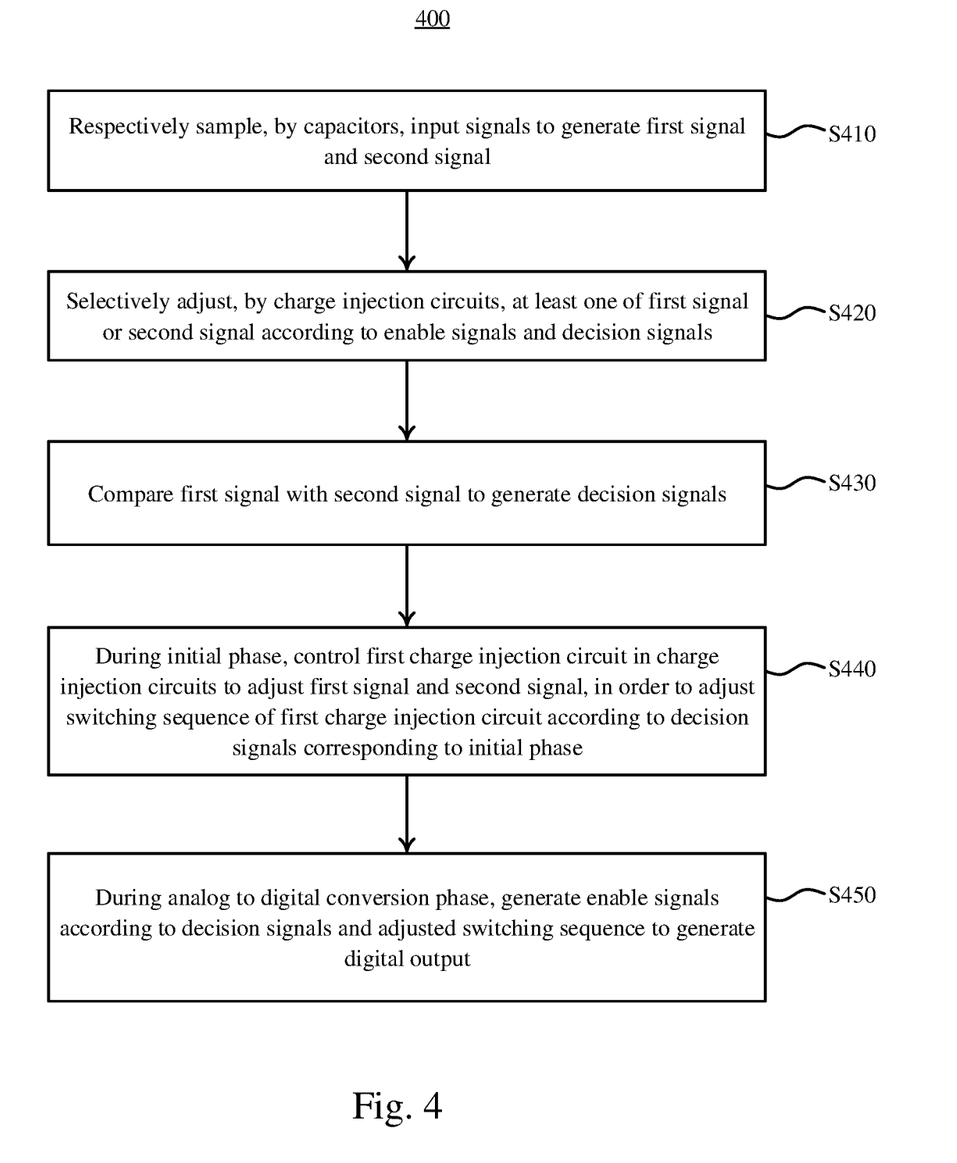
FIG. 4 shows a flow chart of a signal conversion method according to some embodiments of the present disclosure.

FIG. 4 shows a flow chart of a signal conversion method 400 according to some embodiments of the present disclosure. In operation S410, input signals (e.g., the input signal VIP and the input signal VIN) are respectively sampled by capacitors (e.g., the capacitor C1 and the capacitor C2) to generate a first signal and a second signal (e.g., the signal VP and the signal VN). In operation S420, at least one of the first signal or the second signal is selectively adjusted according to enable signals and decision signals by charge injection circuits (e.g., the charge injection circuits 141[1]-141[4]). In operation S430, the first signal and the second signal are compared with each other to generate the decision signals. In operation S440, a first charge injection circuit in the charge injection circuits is controlled to adjust the first signal and the second signal during the initial phase, in order to adjust a switching sequence of the first charge injection circuit according to the decision signals corresponding the initial phase. In operation S450, the enable signals are generated according to the decision signals and the adjusted switching sequence during the analog to digital conversion phase, in order to generate the digital output (e.g., the digital output DOUT).

The above operations can be understood with reference to the aforementioned embodiments, and thus the repetitious descriptions are not further given. The above description of the signal conversion method 400 includes exemplary operations, but the operations of the signal conversion method 400 are not necessarily performed in the order described above. Operations of the signal conversion method 400 can be added, replaced, changed order, and/or eliminated, or the operations of the signal conversion method 400 can be executed simultaneously or partially simultaneously as appropriate, in accordance with the spirit and scope of various embodiments of the present disclosure. For example, operation S440 may be performed during the initial phase after the successive approximation register analog to digital converter 100 is powered on, and operation S410, S420, S430, and S450 may be performed during the successive approximation register analog to digital converter 100 performs the analog to digital conversion.

As described above, the successive approximation register analog to digital converter and the signal conversion method in some embodiments of the present disclosure may reorder the switching sequence of current source circuits in a charge injection circuit during an initial phase after the device is powered on. As a result, the impacts of mismatches can be reduced without using additional digital to analog converter(s), in order to improve the linearity.

Various functional components or blocks have been described herein. As will be appreciated by persons skilled in the art, in some embodiments, the functional blocks will preferably be implemented through circuits (either dedicated circuits, or general purpose circuits, which operate under the control of one or more processors and coded instructions), which will typically comprise transistors or other circuit elements that are configured in such a way as to control the operation of the circuitry in accordance with the functions and operations described herein. As will be further appreciated, the specific structure or interconnections of the circuit elements will typically be determined by a compiler, such as a register transfer language (RTL) compiler. RTL compilers operate upon scripts that closely resemble assembly language code, to compile the script into a form that is used for the layout or fabrication of the ultimate circuitry. Indeed, RTL is well known for its role and use in the facilitation of the design process of electronic and digital systems.

The aforementioned descriptions represent merely the preferred embodiments of the present disclosure, without any intention to limit the scope of the present disclosure thereto. Various equivalent changes, alterations, or modifications based on the claims of the present disclosure are all consequently viewed as being embraced by the scope of the present disclosure.

What is claimed is:

1. A successive approximation register analog to digital converter, comprising:
    a charge injection digital to analog converter circuit comprising a plurality of capacitors and a plurality of charge injection circuits, wherein the plurality of capacitors are configured to respectively sample a plurality of input signals to generate a first signal and a second signal, and the plurality of charge injection circuits are configured to selectively adjust at least one of the first signal or the second signal according to a plurality of enable signals and a plurality of decision signals;
    a comparator circuit configured to compare the first signal with the second signal to generate the plurality of decision signals; and
    a control logic circuitry configured to control a first charge injection circuit in the plurality of charge injection circuits to adjust the first signal and the second signal during an initial phase to adjust a switching sequence of the first charge injection circuit according to the plurality of decision signals corresponding to the initial phase, and generate the plurality of enable signals according to the plurality of decision signals and an adjusted switching sequence during an analog to digital conversion phase, in order to generate a digital output,
    wherein the control logic circuitry is further configured to store a corresponding relation between the plurality of enable signals and the adjusted switching sequence.

2. The successive approximation register analog to digital converter of claim 1, wherein the control logic circuitry is configured to adjust the switching sequence based on currents of a plurality of current source circuits in the first charge injection circuit during the initial phase.

3. The successive approximation register analog to digital converter of claim 1, wherein during the initial phase, the control logic circuitry is configured to control a first current source circuit in the first charge injection circuit to adjust the first signal and control a second current source circuit in the first charge injection circuit to adjust the second signal, the comparator circuit is further configured to repeatedly compare the first signal with the second signal to generate the plurality of decision signals corresponding to the initial phase, and the control logic circuitry is further configured to determine a difference between a current value of the first current source circuit and a current value of the second current source circuit according to the plurality of decision signals corresponding to the initial phase, in order to adjust the switching sequence.

4. The successive approximation register analog to digital converter of claim 1, wherein the first charge injection circuit comprises a plurality of current source circuits, and the control logic circuitry is configured to gradually sum up currents of the plurality of current source circuits based on an ascending order to adjust the switching sequence.

5. The successive approximation register analog to digital converter of claim 1, wherein the plurality of charge injection circuits are configured to selectively adjust charges stored in at least one of the plurality of capacitors according to the plurality of enable signals and the plurality of decision signals, in order to adjust at least one of the first signal or the second signal.

6. The successive approximation register analog to digital converter of claim 1, wherein the first charge injection circuit comprises:
   a plurality of control circuits, wherein each of the plurality of control circuits is configured to generate one of a plurality of switching signals according to a corresponding one of the plurality of enable signals and the plurality of decision signals;
   a plurality of switching circuits, wherein each of the switching circuits is configured to be selectively connected to one of the plurality of capacitors or disconnected from the plurality of capacitors according to a corresponding one of the plurality of switching signals; and
   a plurality of current source circuits, wherein each of the plurality of current source circuits is configured to discharge the one of the plurality of capacitors via a corresponding one of the plurality of switching circuits.

7. A signal conversion method, comprising:
   respectively sampling, by a plurality of capacitors, a plurality of input signals to generate a first signal and a second signal;
   selectively adjusting, by a plurality of charge injection circuits, at least one of the first signal or the second signal according to a plurality of enable signals and a plurality of decision signals;
   comparing the first signal with the second signal to generate the plurality of decision signals;
   controlling a first charge injection circuit in the plurality of charge injection circuits to adjust the first signal and the second signal during an initial phase, in order to adjust a switching sequence of the first charge injection circuit according to the plurality of decision signals corresponding to the initial phase;
   generating the plurality of decision signals according to the plurality of decision signals and an adjusted switching sequence during an analog to digital conversion phase, in order to generate a digital output; and
   storing a corresponding relation between the plurality of enable signals and the adjusted switching sequence.

8. The signal conversion method of claim 7, wherein controlling the first charge injection circuit in the plurality of charge injection circuits to adjust the first signal and the second signal during the initial phase, in order to adjust the switching sequence of the first charge injection circuit according to the plurality of decision signals corresponding to the initial phase comprises:
   adjusting the switching sequence based on currents of a plurality of current source circuits in the first charge injection circuit during the initial phase.

9. The signal conversion method of claim 7, wherein controlling the first charge injection circuit in the plurality of charge injection circuits to adjust the first signal and the second signal during the initial phase, in order to adjust the switching sequence of the first charge injection circuit according to the plurality of decision signals corresponding to the initial phase comprises:
   adjusting, by a first current source circuit in the first charge injection circuit, the first signal during the initial phase;
   adjusting, by a second current source circuit in the first charge injection circuit, the second signal during the initial phase;
   repeatedly comparing the first signal with the second signal, in order to generate the plurality of decision signals corresponding to the initial phase; and
   determining a difference between a current value of the first current source circuit and a current value of the second current source circuit according to the plurality of decision signals corresponding to the initial phase, in order to adjust the switching sequence.

10. The signal conversion method of claim 7, wherein the first charge injection circuit comprises a plurality of current source circuits, and controlling the first charge injection circuit in the plurality of charge injection circuits to adjust the first signal and the second signal during the initial phase, in order to adjust the switching sequence of the first charge injection circuit according to the plurality of decision signals corresponding to the initial phase comprises:
   gradually summing up currents of the plurality of current source circuits based on an ascending order to adjust the switching sequence.

11. The signal conversion method of claim 7, wherein selectively adjusting, by the plurality of charge injection circuits, the at least one of the first signal or the second signal according to the plurality of enable signals and the plurality of decision signals comprises:
   selectively adjusting, by the plurality of charge injection circuits, charges stored in at least one of the plurality of capacitors according to the plurality of enable signals and the plurality of decision signal signals, in order to adjust at least one of the first signal or the second signal.

12. A successive approximation register analog to digital converter, comprising:
   a charge injection digital to analog converter circuit comprising a plurality of capacitors and a plurality of charge injection circuits, wherein the plurality of capacitors are configured to respectively sample a plurality of input signals to generate a first signal and a second signal, and the plurality of charge injection circuits are configured to selectively adjust at least one of the first signal or the second signal according to a plurality of enable signals and a plurality of decision signals;
   a comparator circuit configured to compare the first signal with the second signal to generate the plurality of decision signals; and
   a control logic circuitry configured to control a first charge injection circuit in the plurality of charge injection circuits to adjust the first signal and the second signal during an initial phase to adjust a switching sequence of the first charge injection circuit according to the plurality of decision signals corresponding to the initial phase, and generate the plurality of enable signals according to the plurality of decision signals and an adjusted switching sequence during an analog to digital conversion phase, in order to generate a digital output,
wherein the control logic circuitry is configured to adjust the switching sequence based on currents of a plurality of current source circuits in the first charge injection circuit during the initial phase.

\* \* \* \* \*